United States Patent
Aronowitz et al.

(10) Patent No.: US 6,511,925 B1
(45) Date of Patent: Jan. 28, 2003

(54) PROCESS FOR FORMING HIGH DIELECTRIC CONSTANT GATE DIELECTRIC FOR INTEGRATED CIRCUIT STRUCTURE

(75) Inventors: Sheldon Aronowitz, San Jose, CA (US); Vladimir Zubkov, Mountain View, CA (US); Helmut Puchner, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/033,164

(22) Filed: Oct. 19, 2001

(51) Int. Cl.$^7$ .......................................... H01L 21/8238
(52) U.S. Cl. ...................... 438/788; 438/216; 438/240; 438/261; 438/287; 438/783
(58) Field of Search ................................ 438/216, 240, 438/261, 287, 5.91, 783, 785, 787, 788, FOR 202

(56) References Cited

U.S. PATENT DOCUMENTS

| | | | |
|---|---|---|---|
| 4,987,102 A | * | 1/1991 | Nguyen et al. |
| 5,242,561 A | * | 9/1993 | Sato |
| 5,429,995 A | * | 7/1995 | Nishiyama et al. |
| 5,660,895 A | * | 8/1997 | Lee et al. |
| 5,874,367 A | | 2/1999 | Dobson ...................... 438/787 |
| 5,915,190 A | * | 6/1999 | Pirkle |
| 6,156,620 A | | 12/2000 | Puchner et al. ............. 438/400 |
| 6,184,072 B1 | | 2/2001 | Kaushik et al. ............. 438/197 |
| 6,284,158 B1 | * | 2/2001 | Shufflebotham et al. |
| 6,251,761 B1 | * | 6/2001 | Rodder et al. |
| 6,261,973 B1 | * | 7/2001 | Misium et al. |
| 6,274,512 B1 | * | 8/2001 | Hayashi et al. |
| 6,281,146 B1 | * | 8/2001 | Wang et al. |
| 6,346,302 B2 | * | 2/2002 | Kishimoto et al. |
| 6,346,488 B1 | * | 2/2002 | Kabansky |

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

*Primary Examiner*—George Fourson
*Assistant Examiner*—Joannie Adelle Garcia
(74) *Attorney, Agent, or Firm*—John P. Taylor

(57) ABSTRACT

In accordance with the invention a high-k gate dielectric is formed by the steps of first forming a silicon oxide layer over a silicon substrate and then exposing the silicon oxide to a flux of low energy plasma containing metal ions which, when inserted into silicon oxide, form a high-k dielectric material suitable for use as a high-k gate dielectric. In one embodiment, the silicon oxide is exposed to a first plasma containing a first species of metal ions and then to a plasma of another species of metal ions which, when inserted into the silicon oxide with the metal ions in the first plasma, further increase the dielectric constant of the silicon oxide.

27 Claims, 1 Drawing Sheet

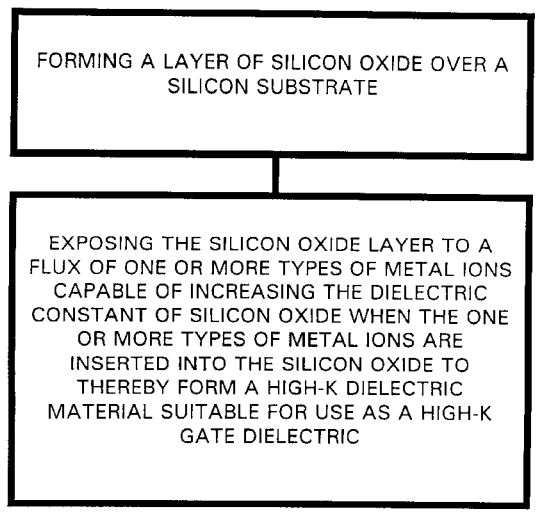

FORMING A LAYER OF SILICON OXIDE OVER A SILICON SUBSTRATE

EXPOSING THE SILICON OXIDE LAYER TO A FLUX OF ONE OR MORE TYPES OF METAL IONS CAPABLE OF INCREASING THE DIELECTRIC CONSTANT OF SILICON OXIDE WHEN THE ONE OR MORE TYPES OF METAL IONS ARE INSERTED INTO THE SILICON OXIDE TO THEREBY FORM A HIGH-K DIELECTRIC MATERIAL SUITABLE FOR USE AS A HIGH-K GATE DIELECTRIC

PROCESS FOR FORMING HIGH DIELECTRIC CONSTANT GATE DIELECTRIC FOR INTEGRATED CIRCUIT STRUCTURE

BACKGROUND OF THE INVENTION

1. Field of the Invention

This invention relates to a process for forming integrated circuit structures. More particularly, this invention relates to a process for forming a high dielectric constant gate dielectric for an MOS transistor of an integrated circuit structure.

2. Description of the Related Art

In the continuing reduction of scale in integrated circuit structures, the dimensions of active devices have become smaller and smaller, as well as the dimensions of the lines between the active devices. The shrinking of the field-effect device channel length in an active device requires an increase in the capacitance of the gate electrode in order to achieve desired performance. However, when the gate dielectric is $SiO_2$, there are difficulties associated with decreasing the gate oxide thickness to achieve such desired increase in capacitance. Such difficulties include increased leakage across the thin silicon oxide dielectric, when the oxide thickness is reduced to 1 nanometer (nm) or less, as well as diffusion of dopant from the gate electrode through the thin gate oxide to the channel region of the silicon substrate below the thin gate oxide dielectric.

An alternate approach has been to form a high dielectric constant (high-k) gate dielectric by depositing high-k dielectrics such as $ZrO_2$, $HfO_2$, and mixtures of either or both with $SiO_2$. One difficulty with this approach, generally, is that these materials are mismatched to the silicon lattice. The consequence of this mismatch is formation of interface states, a very undesirable feature. There are also questions involving the stability of these high-k materials to mechanical and temperature induced stresses. An additional problem with the use of such high k dielectric material is their sensitivity to formation temperature to avoid crystallinity (which could effect leakage and dopant migration).

Attempts to address these issues have led to growing a very thin layer of $SiO_2$, to avoid formation of interface states due to lattice mismatch, and then depositing a layer of the high-k dielectric material over the thin layer of $SiO_2$. However, since the reciprocal of the total capacitance of the gate dielectric is the sum of the reciprocals of the capacitance of the thin $SiO_2$ layer plus the capacitance of the high-k layer, the presence of the thin $SiO_2$ layer reduces the effectiveness of the high-k dielectric layer.

Exposure of a silicon oxide surface to a low energy nitrogen plasma to insert nitrogen atoms into silicon oxide is taught in Puchner et al. U.S. Pat. No. 6,156,620; Aronowitz et al. U.S. patent application Ser. No. 09/464,297, filed Dec. 15, 1999; and Aronowitz et al. U.S. patent application Ser. No. 09/521,312, filed Mar. 9, 2000; all assigned to the assignee of this invention and the subject matter of each of which is hereby incorporated herein by reference.

Kaushik et al. U.S. Pat. No. 6,184,072 B1 proposes to first form a layer of silicon oxide over a silicon substrate and then to form a metal layer over the silicon oxide layer, using a metal capable of forming a high-k oxide layer when ions of such metal are diffused into the silicon oxide layer. A diffusion step is then carried out wherein the structure is heated to about 400° C.–800° C. to diffuse metal ions from the metal layer into the silicon oxide layer to form a high-k gate dielectric. The Kaushik et al. patent further teaches implanting or diffusing metal into a silicon substrate followed by a thermal anneal in a oxygen ambient atmosphere which may also contain nitrogen or steam. At the completion of the annealing step a high-k dielectric layer is formed on top of the silicon substrate.

However, it would be preferable to form a high-k dielectric layer suitable for use as a gate dielectric using, as a precursor, a conventional silicon oxide which is then modified to form the desired high-k gate dielectric.

SUMMARY OF THE INVENTION

In accordance with the invention a high-k gate dielectric is formed by the steps of first forming a silicon oxide layer over a silicon substrate and then exposing the silicon oxide to a flux of low energy plasma containing metal ions which, when inserted into silicon oxide, form a high-k dielectric material suitable for use as a high-k gate dielectric. In one embodiment, the silicon oxide is exposed to a first plasma containing a first species of metal ions and then to a plasma of another species of metal ions which, when inserted into the silicon oxide with the metal ions in the first plasma, further increase the dielectric constant of the silicon oxide.

BRIEF DESCRIPTION OF THE DRAWING

The sole drawing is a flowsheet illustrating the process of the invention.

DETAILED DESCRIPTION OF THE INVENTION

The invention comprises a process for forming a high-k gate dielectric by the steps of first forming a silicon oxide layer over a silicon substrate and then exposing the silicon oxide to a flux of low energy plasma containing metal ions which, when inserted into the silicon oxide layer, form a high-k dielectric material suitable for use as a high-k gate dielectric. In one embodiment, the silicon oxide is exposed to a first plasma containing a first species of metal ions and then to a plasma of another species of metal ions which, when inserted into the silicon oxide with the metal ions in the first plasma, further increase the dielectric constant of the silicon oxide.

The term "high-k", as used herein, is intended to define a dielectric material having a dielectric constant of at least about 4.5, preferably at least about 5.0, more preferably at least about 5.5, and most preferably greater than about 6.0.

The silicon oxide layer formed over the silicon substrate may be formed by any conventional process used for the formation of silicon oxide suitable for use as gate oxide such as by thermal oxidation in the presence of wet steam. The thickness of the silicon oxide layer formed over the silicon substrate should, before doping, range from about 1.0 nm to about 5.0 nm, and preferably will range from about 1.5 nm to about 3.5 nm.

The metal ions to be inserted into the $SiO_2$ lattice can be characterized as comprising those metal ions which, when inserted into $SiO_2$, will raise the overall dielectric constant of the doped silicon oxide dielectric material from the undoped level of about 3.7 up to at least the minimum high-k level defined above. The metal ions to be inserted into the $SiO_2$ bonds of the oxide film can be further characterized as comprising those metal ions which will, upon insertion into the $SiO_2$, have an energy release of at least 1.4 electron volts (eV), and preferably have an energy release of at least about 2.0 Ev. The greater the energy released by the metal ion upon insertion into the SiO$_2$ structure, the more unlikely that undesired redistribution of the metal ions will occur with subsequent anneal unless the thermal budget of the structure is large.

Metal ions meeting these criteria and therefore which, when inserted into the silicon oxide layer, form a high-k dielectric material, and which are, therefore, useful in the practice of the process of the invention include the following: group 3 metals scandium (Sc), yttrium (Y), lanthanum (La), and the rare earth elements 58–71; group 4 metals titanium (Ti), zirconium (Zr), and hafnium (Hf); group 5 metals vanadium (V), niobium (Nb), and tantalum (Ta); and group 6 metals chromium (Cr), molybdenum (Mo), and tungsten (W); and selenium (Se) and tin (Sn). Of all of these metal ions, those from groups 4–6 are preferred. Particularly preferred metal ions from groups 4–6 are tungsten, hafnium, niobium, zirconium, and tantalum, which all have a release energy of over 2 eV.

The metal ions may be introduced into the plasma as compounds wherein insertion of the anion of the compound into the silicon oxide layer is preferably not energetically favorable. For example, tungsten, hafnium, niobium, zirconium, and tantalum may be respectively introduced into the plasma as bromides, i.e., WBr$_5$, HfBr$_4$, NbBr$_5$, ZrBr$_4$, and TaBr$_5$ because the insertion of bromine ions into the silicon oxide is not energetically favorable. When it is desired to insert more than one specie of metal ion into the silicon oxide layer, this may be carried out by first exposing the silicon oxide surface to one plasma containing one specie of the metal ions (e.g., tungsten as WBr$_5$) and then introducing the silicon oxide surface to a second plasma containing another species of metal ion (e.g., hafnium as HfBr$_4$).

The term "low energy plasma", as used herein, comprises a plasma with metal ions having sufficient energy to penetrate into the silicon oxide layer, but insufficient to penetrate through the silicon oxide layer into the underlying silicon substrate, and insufficient to result in any sputtering of the silicon oxide layer. The power level of the plasma should be kept within a range of from about 500 watts to about 5,000 watts to maintain the desired low energy plasma.

A DC bias can be placed on the silicon oxide target, but the kinetic energy imparted to the particles by such bias should not be sufficient to result in penetration of the metal ions through the silicon oxide layer into the underlying silicon substrate. Preferably the insertion of the metal ions is carried out without the use of any bias on the silicon oxide layer. To avoid sputtering, the mean value of the energy of a particle in the plasma should be less than about 25 eV, and may be as low as 10 eV for very thin silicon oxide layers. Typically, the mean energy of each metal ion will range from about 10 eV to about 20 eV. No other acceleration energy should be applied to the metal ions other than the above-mentioned target bias.

The desired flux of the metal ions in the plasma should range from about $10^{12}$ atoms/cm$^2$/second to about $10^{13}$ atoms/cm$^2$/second. To achieve this, the pressure in the reaction chamber should be maintained in the millitorr range, e.g., from about 10 millitorr to about 500 millitorr. The temperature in the reactor should range from about 50° C. to about 300° C. and preferably should be at least 100° C., but not exceeding about 200° C. The time of the exposure of the silicon oxide layer to the plasma should be at least about 0.1 minutes to about 100 minutes. Suitable plasma reactors which can be used for the insertion of the metal ions into the silicon oxide layer include, by way of example and not of limitation, the Trikon Helicon reactor and the LAM 9400 SE reactor.

To further illustrate the practice of the process of the invention, a 3.0 nm thick silicon oxide suitable for use as a gate oxide is thermally grown on a silicon substrate. The substrate with the silicon oxide layer thereon can then be placed in a plasma reactor into which can be flowed ZrBr$_4$ to form a plasma while maintaining a pressure of 10 millitorr and a substrate temperature of about 25° C. The power level of the plasma is maintained at a level which will provide sufficient energy to the zirconium ions to cause insertion of the zirconium ions into the silicon oxide without causing any sputtering nor any penetration of the zirconium ions through the silicon oxide into the underlying silicon substrate. The specific power levels will differ with the specific type of reactor. When the dielectric constant of the silicon oxide gate dielectric doped with the zirconium ions is measured, it will be found to have increased over undoped silicon oxide of the same thickness. If a further increase in the dielectric constant of the doped silicon oxide is desired, a negative rf DC bias may be applied to the silicon oxide to increase the penetration of the zirconium ions into the silicon oxide layer. Alternatively or additionally the doped silicon oxide may be exposed to a second plasma to insert different metal ions, e.g., hafnium ions, into the silicon oxide layer to further increase the dielectric constant of the doped silicon oxide gate dielectric.

Thus, the dielectric constant of a gate dielectric may be increased to thereby increase the capacitance of the gate dielectric without mismatching of the gate dielectric to the silicon lattice and without the need for the formation of multiple gate dielectric layers. The use of a plasma of the metal ions to insert such metal ions into the gate dielectric ensures adequate penetration of the metal ions throughout the gate dielectric layer. Implantation of the metal ions into the gate dielectric layer using externally applied energy to the metal ions is avoided to prevent undesirable penetration of the metal ions through the gate dielectric layer into the underlying silicon substrate.

Having thus described the invention what is claimed is:

1. A process for forming a high-k gate dielectric by the steps of:
    a) first forming a silicon oxide layer over a silicon substrate; and
    b) then exposing the silicon oxide to a flux of low energy plasma containing metal ions which, when inserted into silicon oxide, form a high-k dielectric material suitable for use as a high-k gate dielectric.

2. The process of claim 1 wherein said metal ions which, when inserted into silicon oxide, form a high-k dielectric material suitable for use as a high-k gate dielectric, are selected from the group consisting of:
    a) group 3 metals scandium (Sc), yttrium (Y), lanthanum (La), and the rare earth elements 58–71;
    b) group 4 metals titanium (Ti), zirconium (Zr), and hafnium (Hf);
    c) group 5 metals vanadium (V), niobium (Nb), and tantalum (Ta);
    d) group 6 metals chromium (Cr), molybdenum (Mo), and tungsten (W); and
    e) selenium (Se) and tin (Sn).

3. The process of claim 1 wherein said metal ions which, when inserted into silicon oxide, form a high-k dielectric material suitable for use as a high-k gate dielectric, are selected from the group consisting of:

a) group 4 metals titanium (Ti), zirconium (Zr), and hafnium (Hf);

b) group 5 metals vanadium (V), niobium (Nb), and tantalum (Ta); and c) group 6 metals chromium (Cr), molybdenum (Mo), and tungsten (W).

4. The process of claim 1 wherein said metal ions which, when inserted into silicon oxide, form a high-k dielectric material suitable for use as a high-k gate dielectric, are selected from the group consisting of tungsten, hafnium, niobium, zirconium, and tantalum.

5. The process of claim 1 wherein said metal ions in said plasma have an energy release level of at least about 1.4 eV when inserted into said silicon oxide.

6. The process of claim 1 wherein said metal ions in said plasma have an energy release level of at least about 2.0 eV when inserted into said silicon oxide.

7. The process of claim 1 wherein said flux of low energy plasma containing metal ions is formed from a compound of said metal ions and anions wherein insertion of said anions into said silicon oxide is not energetically favorable at the energy level of said metal ions in said plasma.

8. The process of claim 1 including the further step of then exposing the silicon oxide to a second flux of low energy plasma containing a different species of metal ions which, when inserted into silicon oxide, forms yet a higher-k dielectric material.

9. The process of claim 1 wherein said step of exposing the silicon oxide to a flux of low energy plasma containing metal ions which, when inserted into silicon oxide, form a high-k dielectric material further comprises exposing said silicon oxide to a first plasma containing a first species of metal ions and then exposing said silicon oxide to a plasma of another species of metal ions which, when inserted into said silicon oxide after said insertion of said first species of metal ions in said first plasma, further increase the dielectric constant of said silicon oxide.

10. The process of claim 1 wherein said step of forming a silicon oxide layer over a silicon substrate further comprises forming from about 1 nm to about 5 nm of silicon oxide over said silicon substrate.

11. The process of claim 1 wherein said step of forming a silicon oxide layer over a silicon substrate further comprises forming from about 1 nm to about 2 nm of silicon oxide over said silicon substrate.

12. The process of claim 1 wherein the pressure, during said step of exposing said silicon oxide to said flux of low energy plasma containing metal ions, ranges from about 10 millitorr to about 500 millitorr.

13. The process of claim 1 wherein the temperature, during said step of exposing said silicon oxide to said flux of low energy plasma containing metal ions, ranges from about 50° C. to about 300° C.

14. The process of claim 1 wherein the temperature, during said step of exposing said silicon oxide to said flux of low energy plasma containing metal ions, ranges from about 100° C. to about 200° C.

15. The process of claim 1 wherein the time of exposure of said silicon oxide to said flux of low energy plasma containing metal ions ranges from about 0.1 minutes to about 100 minutes.

16. The process of claim 1 wherein the energy imparted to said metal ions by said low energy plasma is sufficient to insert said metal ions into said silicon oxide but insufficient to cause sputtering or to permit said metal ions to pass through said silicon oxide into said silicon substrate.

17. The process of claim 1 wherein the energy imparted to each of said metal ions by said low energy plasma is less than 25 eV.

18. The process of claim 1 wherein the energy imparted to each of said metal ions by said low energy plasma ranges from about 10 eV to about 20 eV.

19. The process of claim 1 where said plasma power ranges from about 500 watts to about 5000 watts.

20. The process of claim 1 wherein a DC bias is applied to said silicon substrate during said step of exposing said silicon oxide to a flux of low energy plasma containing metal ions.

21. The process of claim 1 wherein said step of exposing said silicon oxide to a flux of low energy plasma containing metal ions further comprises applying a DC bias to said silicon substrate at an energy level insufficient to permit said metal ions to penetrate through said silicon oxide into said silicon substrate.

22. A process for forming a high-k gate dielectric by the steps of:

a) first forming a silicon oxide layer over a silicon substrate; and b) then exposing the silicon oxide to a flux of low energy plasma containing metal ions selected from the group consisting of:

i) group 3 metals scandium (Sc), yttrium (Y), lanthanum (La), and the rare earth elements 58–71;

ii) group 4 metals titanium (Ti), zirconium (Zr), and hafnium (Hf);

iii) group 5 metals vanadium (V), niobium (Nb), and tantalum (Ta);

iv) group 6 metals chromium (Cr), molybdenum (Mo), and tungsten (W); and v) selenium (Se) and tin (Sn);

wherein said metal ions, when inserted into said silicon oxide, will form a high-k dielectric material suitable for use as a high-k gate dielectric.

23. The process of claim 22 wherein the energy imparted to said metal ions by said low energy plasma is sufficient to insert said metal ions into said silicon oxide but insufficient to cause sputtering or to permit said metal ions to pass through said silicon oxide into said silicon substrate.

24. The process of claim 22 wherein the energy imparted to each of said metal ions by said low energy plasma is less than 25 eV.

25. The process of claim 22 wherein said step of exposing said silicon oxide to a flux of low energy plasma containing metal ions further comprises applying a DC bias to said silicon substrate at an energy level insufficient to permit said metal ions to penetrate through said silicon oxide into said silicon substrate.

26. The process of claim 22 wherein, during said step of exposing said silicon oxide to said flux of low energy plasma containing metal ions, the pressure ranges from about 10 millitorr to about 500 millitorr, the temperature ranges from about 50° C. to about 300° C., and the time of exposure of said silicon oxide to said flux of low energy plasma containing metal ions ranges from about 0.1 minutes to about 100 minutes.

27. A process for forming a high-k gate dielectric by the steps of:

a) first forming a silicon oxide layer over a silicon substrate; and b) then exposing the silicon oxide to a flux of low energy plasma containing metal ions, each having an energy imparted to them by said low energy plasma sufficient to insert said metal ions into said silicon oxide but insufficient to cause sputtering or to permit said metal ions to pass through said silicon oxide into said silicon substrate said metal ions selected from the group consisting of:
i) group 3 metals scandium (Sc), yttrium (Y), lanthanum (La), and the rare earth elements 58–71;
ii) group 4 metals titanium (Ti), zirconium (Zr), and hafnium (Hf);
iii) group 5 metals vanadium (V), niobium (Nb), and tantalum (Ta);
iv) group 6 metals chromium (Cr), molybdenum (Mo), and tungsten (W); and
v) selenium (Se) and tin (Sn);

wherein said metal ions, when inserted into said silicon oxide, will form a high-k dielectric material suitable for use as a high-k gate dielectric.

* * * * *